United States Patent
Wakamatsu et al.

(10) Patent No.: US 6,932,954 B2
(45) Date of Patent: Aug. 23, 2005

(54) METHOD FOR PRODUCING SILICON (75) Inventors: Satoru Wakamatsu, Tokuyama (JP); Hiroyuki Oda, Tokuyama (JP)

(73) Assignee: Tokuyama Corporation, Tokuyama (JP)

( * ) Notice: Subject to any disclaimer, the term of this patent is extended or adjusted under 35 U.S.C. 154(b) by 98 days.

(21) Appl. No.: 10/450,947

(22) PCT Filed: Oct. 18, 2002

(86) PCT No.: PCT/JP02/10848

§ 371 (c)(1), (2), (4) Date: Jun. 18, 2003

(87) PCT Pub. No.: WO03/040036

PCT Pub. Date: May 15, 2003

(65) Prior Publication Data

US 2004/0052716 A1 Mar. 18, 2004

(30) Foreign Application Priority Data

Oct. 19, 2001 (JP) .......................... 2001-322571
Mar. 27, 2002 (JP) .......................... 2002-087451

(51) Int. Cl.$^7$ ............................................. C01B 33/02
(52) U.S. Cl. ........................................ 423/350; 423/349
(58) Field of Search ........................ 423/324, 348, 423/349, 350; 422/139, 141, 142, 147, 189, 234

(56) References Cited

U.S. PATENT DOCUMENTS

| | | | |
|---|---|---|---|
| 3,933,985 A | | 1/1976 | Rodgers |
| 4,141,764 A | | 2/1979 | Authier et al. |
| 4,213,937 A | * | 7/1980 | Padovani et al. ........... 422/142 |
| 4,340,574 A | * | 7/1982 | Coleman ................... 423/347 |
| 6,060,021 A | | 5/2000 | Oda |

FOREIGN PATENT DOCUMENTS

| | | |
|---|---|---|
| JP | 36-9054 B1 | 6/1961 |
| JP | 51-37819 A | 3/1976 |
| JP | 52-133022 A | 11/1977 |
| JP | 57-156318 A | 9/1982 |
| JP | 62-108726 A | 5/1987 |
| JP | 10-287413 A | 10/1998 |
| JP | 11-314996 A | 11/1999 |

* cited by examiner

Primary Examiner—Collen P. Cooke
(74) Attorney, Agent, or Firm—Birch, Stewart, Kolasch & Birch, LLP (57) ABSTRACT

A silicon production process which improves the production efficiency of trichlorosilane while an industrially advantageous output is ensured and the amount of the by-produced tetrachlorosilane is suppressed. This process does not require a bulky reduction apparatus for the by-produced tetrachlorosilane, can construct a closed system, which is a self-supporting silicon production process, can easily control the amount of the by-produced tetrachlorosilane and therefore can adjust the amount of tetrachlorosilane to be supplied to a tetrachlorosilane treating system when the tetrachlorosilane treating system is used.

This process comprises a silicon deposition step for forming silicon by reacting trichlorosilane with hydrogen at a temperature of 1,300° C. or higher, a trichlorosilane forming step for forming trichlorosilane by contacting the exhausted gas in the above silicon deposition step to raw material silicon to react hydrogen chloride contained in the exhausted gas with silicon, and a trichlorosilane first recycling step for separating trichlorosilane from the exhausted gas in the trichlorosilane forming step and recycling it to the silicon deposition step.

6 Claims, 4 Drawing Sheets

METHOD FOR PRODUCING SILICON

This application is the national phase under 35 U.S.C. §371 of PCT International Application No. PCT/JP02/10848 which has an International filing date of Oct. 18, 2002, which designated the United States of America.

FIELD OF THE INVENTION

The present invention relates to a novel silicon production process. More specifically, it relates to a process of producing silicon through a reaction between trichlorosilane (may be abbreviated as TCS hereinafter) and hydrogen, which is capable of carrying out the treatment of tetrachlorosilane (may be abbreviated as STC hereinafter) formed by a silicon deposition reaction industrially extremely advantageously.

DESCRIPTION OF THE PRIOR ART

High-purity silicon obtained from TCS can be produced from a reaction between TCS and hydrogen. As an industrial production process, there is known a so-called "Siemens process" in which the surface of a silicon rod is heated and TCS is supplied to the rod together with hydrogen to deposit silicon on the rod in order to obtain a grown polycrystal silicon rod.

The above deposition reaction is generally carried out at a temperature of 900 to 1,250° C., substantially 900 to 1,150° C. to deposit silicon stably, and STC and hydrogen chloride are by-produced by the deposition reaction.

As for the amounts of STC and hydrogen chloride formed by the silicon deposition reaction at the above temperature range employed by the above Siemens process, STC is formed in an overwhelming amount.

When 1 ton of high-purity silicon is to be produced by the Siemens process at the above temperature range, STC is formed in an amount of 15 to 25 tons and hydrogen chloride is formed in an amount of 0.1 to 1 tons.

STC by-produced by the silicon deposition reaction is a compound which is chemically much more stable than TCS. As shown in the following reaction formulas, as STC is contained in TCS more, the rate of the silicon deposition reaction becomes lower, thereby greatly reducing the efficiency of the silicon deposition reaction due to an equilibrium impediment factor as well.
Delay of Deposition Reaction Rate $$TCS+H_2 \rightarrow Si+HCl+DCS+TCS+STC \quad (1)$$

$$STC+H_2 \rightarrow Si+HCl+DCS+TCS+STC \quad (2)$$

(DSC is dichlorosilane)
The yield of Si under the same reaction conditions is the formula (1):formula (2)=5:1.
Equilibrium Impediment $$TCS+H_2 \rightarrow Si+HCl+DCS+TCS+STC$$

In the above formula, when STC in a formed system is existent in a raw material system, equilibrium tends to be left-sided.
(law of Le Chatelier)

Therefore, in a system for carrying out the silicon deposition reaction on an industrial scale, part or all of STC formed in large quantities by the silicon deposition reaction must be discharged to a treating system (to be referred to as "STC treating system" hereinafter) nearby or at a distance.

Examples of the STC treating system include a system for producing fumed silica or quartz by hydrolyzing STC with oxyhydrogen flames and an epitaxial system for silicon wafers.

However, the consumption of STC in the STC treating system is affected by demand for fumed silica or the like produced therefrom. When the demand decreases, surplus STC which cannot be treated must be abandoned. Thus it is difficult to balance between the production of silicon and demand for STC, and a basic solution to the treatment of STC which is formed in large quantities has not yet been found.

To cope with the above problem, closed systems have been proposed by JP-A 52-133022 and JP-A 10-287413 (the term "JP-A" as used herein means an "unexamined published Japanese patent application") as a self-supporting process for reducing the output of STC and discharging no STC. However, these systems are only based on an ideal system. That is, the system of JP-A 52-133022 provides a closed system technology for specifying the composition of a gas used for the deposition of silicon to deposit silicon at a temperature of 900 to 1,250° C. in order to suppress the by-production of STC. However, as seen in its Examples, a silicon deposition reaction system is placed under conditions close to an equilibrium state (ideal system) by making the amount of the supplied gas extremely small for the reaction area. It is difficult to ensure an industrially effective output under the above conditions. When the supply of the raw material gas having the above composition is increased to ensure the output, the reaction rate of TCS greatly lowers, which makes it difficult to carry out the silicon deposition reaction on an industrial scale.

In order to produce silicon in an industrially advantageous amount at the above deposition temperature, the proportion of gaseous hydrogen must be reduced to improve the reaction rate of TCS, thereby sharply increasing the by-production of STC.

Therefore, to carry out the deposition of silicon at a relatively low temperature of 1,250° C. or lower on an industrial scale, the by-production of a large amount of STC is inevitable as described above and a technology for carrying out a closed system industrially has not yet been completed.

As a process for producing TCS from STC, JP-A 57-156318 proposes a process for obtaining TCS by converting STC into TCS through hydrogen reduction and then reacting the hydrogen chloride of the reaction gas with low-purity silicon of a metallurgical grade (metallurgical-grade silicon). However, even this process does not provide a solution to the problem encountered in the step in which STC is formed in an overwhelming amount.

Meanwhile, a process for carrying out a silicon deposition reaction at around 1,410° C. which is the melting point of silicon is proposed by JP-A 11-314996. However, researches are not made into the gas composition at the above deposition temperature as well as an industrial process.

OBJECTS OF THE INVENTION

It is therefore a first object of the present invention to provide a silicon production process which improves the production efficiency of TCS while an industrially advantageous output is ensured and the amount of by-produced STC is reduced.

It is a second object of the present invention to provide a self-supporting silicon production process which does not require a bulky reduction apparatus for by-produced STC and enables the construction of a closed system.

It is a third object of the present invention to provide a silicon production process which can easily control the amount of the by-produced STC and therefore can adjust the amount of STC to be supplied to an STC treating system to any value when the STC treating system is installed.

Other objects and advantages of the present invention will become apparent from the following description.

SUMMARY OF THE INVENTION

The inventors of the present invention have conducted intensive studies to attain the above objects and have found that an industrial process which can reduce the amount of the formed STC to an extremely small value unattainable by the Siemens process by carrying out a silicon deposition reaction between TCS and hydrogen at a specific high temperature range which has not been used for industrial production can be established. Thus, the present invention has been accomplished based on this finding.

That is, the first object and advantage of the present invention are attained by a silicon production process comprising a silicon deposition step for forming silicon by reacting trichlorosilane with hydrogen at a temperature of 1,300° C. or higher, a trichlorosilane forming step for forming trichlorosilane by contacting the exhausted gas in the above silicon deposition step to raw material silicon to react hydrogen chloride contained in the exhausted gas with silicon, and a trichlorosilane first recycling step for separating trichlorosilane from the exhausted gas in the trichlorosilane forming step and recycling it to the silicon deposition step.

They have found that a closed system for discharging substantially no STC to the outside of the process by reducing STC with hydrogen can be constructed because the amount of the by-produced STC is extremely small.

That is, the above second object and advantage of the present invention are advantageously attained by a silicon production process comprising a silicon deposition step for forming silicon by reacting trichlorosilane with hydrogen in a hydrogen/trichlorosilane molar ratio of 10 or more at a temperature of 1,300° C. or higher, a trichlorosilane forming step for forming trichlorosilane by contacting the exhausted gas in the above silicon deposition step to raw material silicon to react hydrogen chloride contained in the exhausted gas with silicon, a trichlorosilane first recycling step for separating trichlorosilane from the exhausted gas in the trichlorosilane forming step and recycling it to the silicon deposition step, a tetrachlorosilane reducing step for reducing tetrachlorosilane contained in the residue after the separation of trichlorosilane in the trichlorosilane first recycling step with hydrogen to obtain trichlorosilane, and a trichlorosilane second recycling step for recycling the exhausted gas in the tetrachlorosilane reducing step to the above trichlorosilane forming step.

Further, the inventors of the present invention have found that the amount of the by-produced STC can be adjusted to an extremely wide range without affecting the quality of the obtained silicon by changing the hydrogen/TCS molar ratio in the silicon deposition reaction at the above high temperature range and the amount of STC to be supplied to an STC treating system can be thereby easily controlled even when the STC treating system is installed.

Therefore, the above third object and advantage of the present invention are attained by a silicon production process comprising a silicon deposition step for forming silicon by reacting trichlorosilane with hydrogen at a temperature of 1,300° C. or higher, a trichlorosilane forming step for forming trichlorosilane by contacting the exhausted gas in the above silicon deposition step to raw material silicon to react hydrogen chloride contained in the exhausted gas with silicon, a trichlorosilane first recycling step for separating trichlorosilane from the exhausted gas in the trichlorosilane forming step and recycling it to the silicon deposition step, a tetrachlorosilane reducing step for reducing a part of tetrachlorosilane contained in the residue after the separation of trichlorosilane in the trichlorosilane first recycling step with hydrogen to obtain trichlorosilane, a trichlorosilane second recycling step for recycling the exhausted gas in the tetrachlorosilane reducing step to the above trichlorosilane forming step, and a tetrachlorosilane supply step for supplying the balance of tetrachlorosilane supplied to the tetrachlorosilane reducing step to a tetrachlorosilane treating system, wherein the amount of tetrachlorosilane to be supplied to the above tetrachlorosilane treating system is changed in the above tetrachlorosilane supply step by changing the molar ratio of hydrogen to trichlorosilane to be supplied to the silicon deposition step.

PREFERRED EMBODIMENTS OF THE INVENTION

In the present invention, the silicon deposition step is to react TCS with hydrogen at a temperature of 1,300° C. or higher, preferably 1,300 to 1,700° C., more preferably the melting point of silicon or higher and 1,700° C. or lower.

In the above silicon deposition step, the method of carrying out the deposition of silicon industrially continuously is not particularly limited. The method preferably uses the apparatus shown in FIG. 1, which is the apparatus basically comprises (1) a cylindrical vessel 1 having an opening 2 which is a silicon output port at the lower end, (2) a heater 3 which can heat the inner wall of the above cylindrical vessel 1 from its lower end to any height at a temperature equal to or higher than the melting point of silicon, (3) a chlorosilane feed pipe 4 for supplying a chlorosilane A, which is open to a space 5 surrounded by the inner wall heated at a temperature of 1,300° C. or higher of the above cylindrical vessel 1 and faces downward, (4) a seal gas feed pipe 6 for supplying a hydrogen gas as a seal gas B into a space formed by the inner wall of the cylindrical vessel 1 and the outer wall of the chlorosilane feed pipe 4, and (5) a cooling material 9 mounted below the above cylindrical vessel 1 with a space therebetween.

Figure 1:
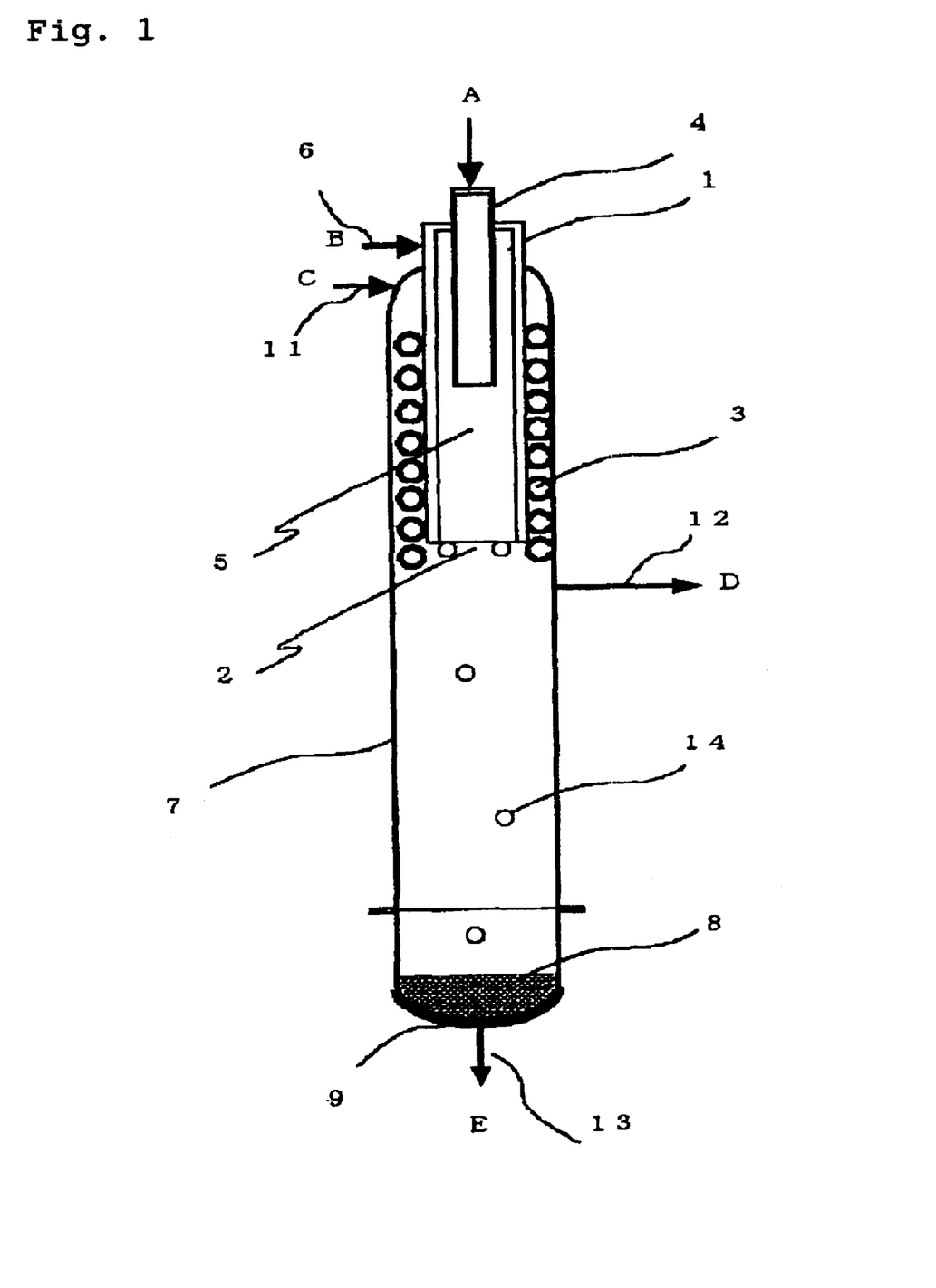
FIGS. 1 and 2 show silicon deposition apparatuses suitably used for carrying out the process of the present invention.

In order to carry out the collection of an exhaust gas D from the cylindrical vessel 1 efficiently in the above apparatus, the cylindrical vessel 1 and the cooling material 9 are preferably covered with a closed vessel 7 provided with an output pipe 12 for the exhaust gas D.

A seal gas C such as nitrogen, hydrogen or argon is preferably supplied by a seal gas feed pipe 11 into a space formed by the outer wall of the cylindrical vessel 1 and the inner wall of the closed vessel 7.

In the above apparatus, the heater 3 for heating the cylindrical vessel 1 is preferably a high-frequency coil. The cylindrical vessel 1 is preferably made from a material which can be heated with high frequency waves and has durability at the melting point of silicon. In general, carbon is preferably used. Carbon coated with silicon carbide, thermally decomposed carbon or boron nitride is preferred because it can improve the durability of the cylindrical vessel and the purity of a silicon product.

In the above apparatus, a chlorosilane supplied from the chlorosilane feed pipe 4 may be mixed with hydrogen. A chlorosilane gas or a mixed gas of a chlorosilane and hydrogen is supplied into the space 5 of the cylindrical vessel 1 together with hydrogen as a seal gas supplied by the seal gas feed pipe 6 and heated by the heater 3 to deposit silicon on the inner wall of the cylindrical vessel 1.

When the cylindrical vessel 1 is heated at a temperature of the melting point of silicon or higher, the deposited silicon flows down over the inner wall of the cylindrical vessel as a silicon molten liquid and is dropped from the opening 2 as a droplet 14 spontaneously. Therefore, the inside of the cylindrical vessel can be always kept in a fixed state without carrying out the periodical operation of increasing the temperature.

When the cylindrical vessel 1 is heated at a temperature of 1,300° C. or higher and lower than the melting point of silicon, silicon separates out as a solid. In this case, when the amount of the deposited silicon reaches a certain value, the heat output is increased or the supply of the gas is reduced to raise the temperature of the cylindrical vessel 1 to a temperature equal to or higher than the melting point of silicon in order to melt part or all of the deposit and drop it. Thus silicon can be collected and deposition can be carried out continuously.

In this text, as a reaction between TCS and hydrogen occurs on the deposition surface of the above cylindrical vessel, the reaction temperature is the heating temperature of the cylindrical vessel.

When the cylindrical vessel 1 is heated at a temperature around the melting point of silicon, silicon may separate out partly in a solid state and partly in a molten state. When the amount of the deposited silicon reaches a certain value, the temperature is raised to melt part or all of the solid and drop it, thereby collecting it as in the above method.

A droplet of the silicon molten liquid or partly molten solid silicon falling from the above cylindrical vessel is dropped on the cooling material 9 which is a receptacle to be solidified and collected as silicon 8.

When silicon is to be dropped as a molten liquid, before falling silicon is received by the cooling material 9 or while silicon is falling before it is received by the cooling material 9, the silicon molten liquid may be made fine by a known method.

The solidified silicon deposit dropped on the cooling material 9 can be taken out from the closed vessel 7 after the deposition reaction is stopped, preferably taken out while the deposition reaction is continued. To collect silicon while the reaction is continued, there is employed a method in which the temperature of the cylindrical vessel 1 is adjusted to 1,300° C. or higher and lower than the melting point to prevent the silicon molten liquid from falling and a valve installed between the deposition reactor and a collection vessel is closed to open a collection unit or a method in which a grinder installed in a collection unit is used to apply mechanical force to the silicon deposit solidified in the collection unit to grind it to a certain extent and silicon E is taken out from a silicon output port 13 located below the cooling material 9 intermittently.

Figure 2:
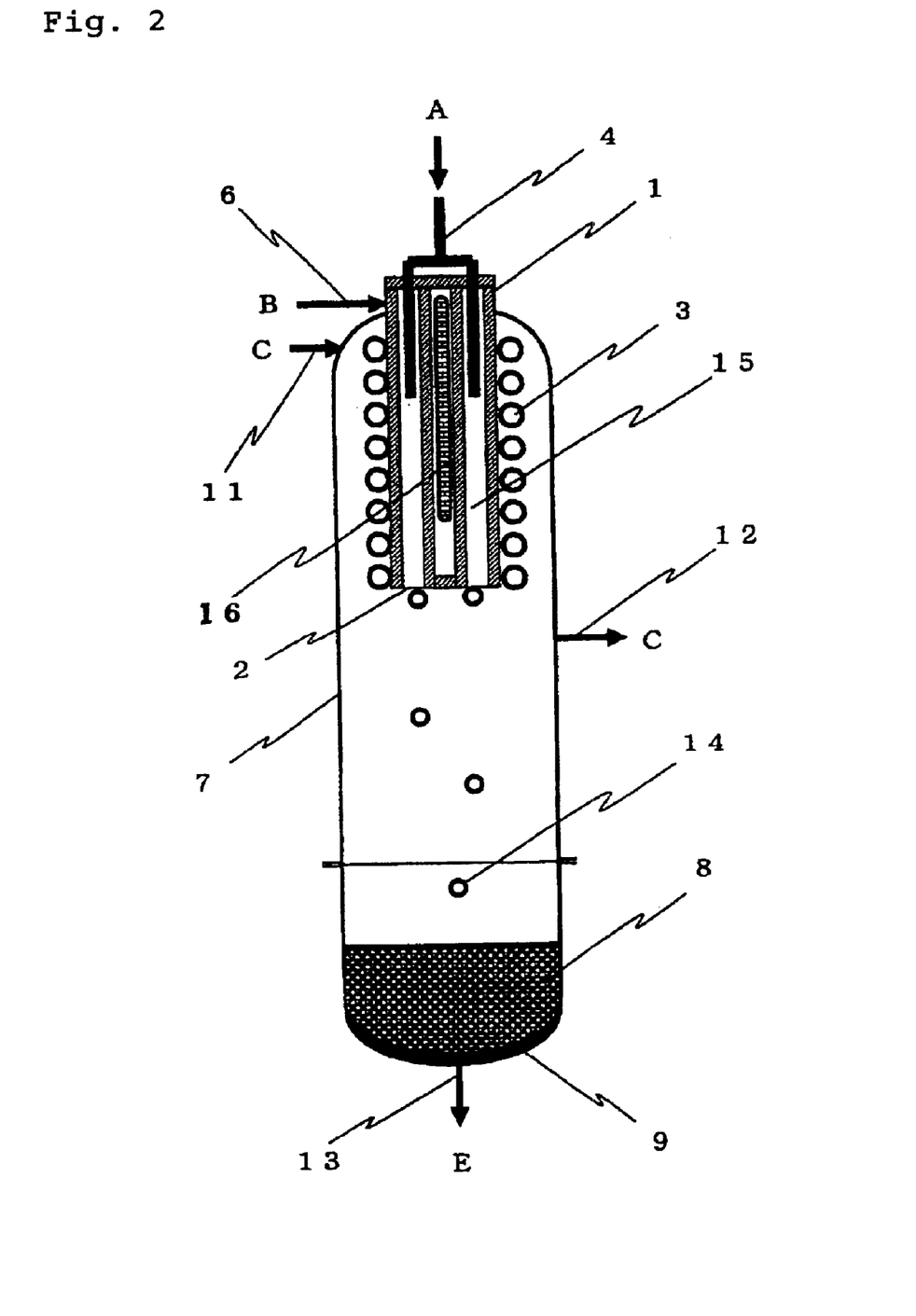

In the reactor shown in FIG. 1, the raw material gas is supplied into the inside of the cylindrical vessel. As shown in FIG. 2, a reactor in which the cylindrical vessel 1 has a multi-structure having an opening at the bottom and the raw material gas A is supplied into a space 15 formed between cylinders from above may be preferably used.

When the apparatus shown in FIG. 2 is used, in order to prevent the blockage of the above space by the deposition of silicon, it is recommended to set the reaction temperature to the melting point of silicon or higher.

Heating means 16 such as a high-frequency generating coil or an electric heater is placed in the central space of the multi-cylindrical vessel to heat an inner cylindrical vessel in particular to the full. In this case, an inert gas is preferably existent in the closed space for installing the heating means 16. The closed space may be evacuated. A heat insulator (unshown) for protecting the heating means 16 may be further provided.

In the process of the present invention, the reaction temperature must be 1,300° C. or higher. This is because the amount of STC formed in the silicon deposition step is effectively reduced and the amount of hydrogen chloride for facilitating the formation of TCS from STC is increased.

Figure 3:
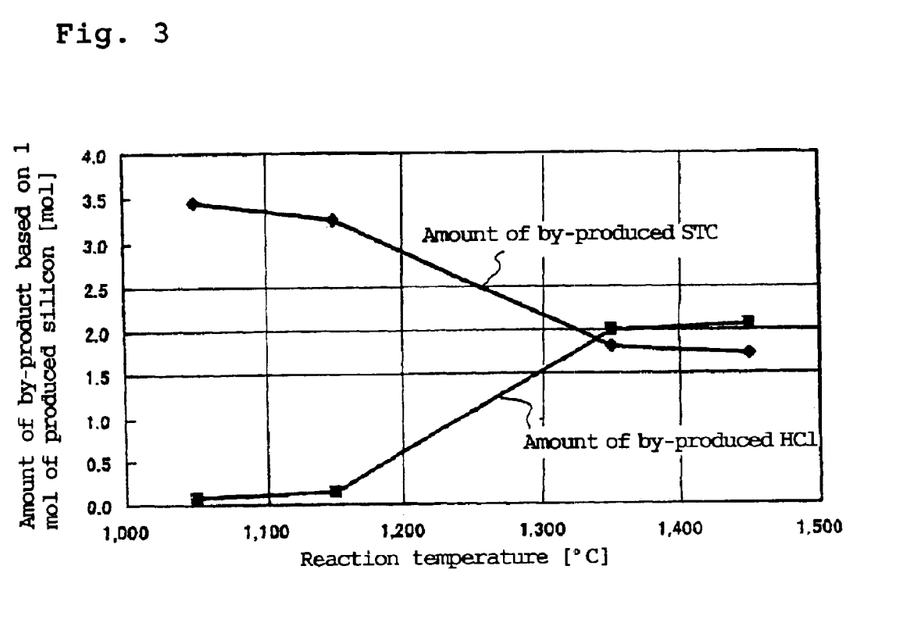
FIG. 3 is a graph showing the tendencies of the amount of STC and the amount of hydrogen chloride at each deposition temperature.

FIG. 3 shows the trends of the amount of the by-produced STC and the amount of the by-produced hydrogen chloride at 1,050° C., 1,150° C., 1,350° C. and 1,410° C. in the reaction when the molar ratio of hydrogen to TCS is 10. As understood from FIG. 3, when the temperature is higher than about 1,300° C., the amount of the by-produced STC greatly decreases and the amount of the by-produced hydrogen chloride increases.

Although the reason why the reaction result obtained when the deposition reaction temperature is 1,300° C. or higher and the reaction result obtained when the conventionally proposed deposition reaction temperature is 1,250° C. or lower differ from each other as described above is not elucidated yet, it is assumed that the temperature of the boundary film near the deposition surface is closely connected with this.

That is, the supplied TCS is fully activated in the high-temperature boundary film to increase its conversion into silicon whereas the activation of TCS is rather insufficient in the low-temperature boundary film with the result that a reaction for disproportionating two molecules of TCS into dichlorosilane and STC readily occurs and a further reaction does not take place. In fact, in the deposition reaction which is carried out at the temperature of the present invention, the amount of the formed dichlorosilane is much smaller than in the Siemens process of the prior art.

It has been found through studies on the present invention that the deposition reaction temperature which can attain the object of the present invention fully is 1,300° C. or higher. By carrying out the silicon deposition reaction at the above temperature, the amount of the formed STC can be reduced to ½ or less that of the Siemens process of the prior art in some cases and to ⅓ in others. At the same time, the amount of the formed hydrogen chloride can be increased to 5 times or more that of the Siemens process in some cases and 10 times in others. Moreover, the silicon deposition rate can be increased to 5 times or more that of the Siemens process in some cases and to 10 times in others, and the reaction rate of the raw material TCS can be increased to 1.5 times or more that of the Siemens process in some cases and to 2 times in others, thereby making it possible to produce a large amount of silicon with a very small-sized deposition reactor.

It is preferred to adjust the molar ratio ($H_2$/TCS) of hydrogen to TCS to be used in the above reaction to 10 or more, preferably 15 to 30 so as to effectively reduce the amount of the formed STC and greatly increase the amount of the formed hydrogen chloride in the silicon deposition step.

Further, the pressure of the above reaction is not particularly limited but preferably normal pressure or higher.

In the present invention, the TCS forming step is the step of forming TCS by contacting the exhausted gas in the silicon deposition step to raw material silicon to react hydrogen chloride contained in the gas with silicon.

The exhausted gas in the silicon deposition step contains hydrogen chloride and STC as the main products and small amounts of dichlorosilane (to be abbreviated as DCS hereinafter) and oligomers of chlorosilanes. The gas also contains unreacted TCS. When this mixed gas is contacted to raw material silicon, hydrogen chloride selectively reacts to form TCS. This reaction is an exothermic reaction which can produce TCS energetically much more advantageously than an endothermic reaction for producing TCS by reducing STC with hydrogen.

As the above raw material silicon may be used known metallurgical-grade silicon which is generally used as a raw material for producing silicon without restriction.

Any reactor capable of contacting the raw material silicon to the exhausted gas from the deposition reaction may be used as the reactor used for the above reaction. For example, a fluidized bed reactor for reacting a raw material silicon powder with a gas while it is fluidized by the gas is preferred for industrial-scale production. As means of adjusting the temperature of the above fluidized bed reactor may be used any known method. For example, a heat exchanger is installed internal or external to the fluidized bed, or the temperature of a preheating gas is adjusted.

In the trichlorosilane forming step, the temperature for starting a reaction between silicon and hydrogen chloride is almost 250° C. Therefore, the reaction temperature must be 250° C. or higher. To improve the yield of TCS, it is preferably 400° C. or lower. In order to continue the reaction industrially stably, the reaction temperature is particularly preferably adjusted to 280 to 350° C.

In the present invention, the exhausted gas obtained from the TCS forming step is supplied to the TCS first recycling step to separate TCS contained in the gas and recycle it to the above silicon deposition step. Hydrogen to be recycled is preferably obtained by removing parts of chlorosilanes from the gas. Various known methods may be used to separate hydrogen from the chlorosilanes but this can be easily carried out by cooling the gas industrially. To cool the gas, it may just pass through a cooled heat exchanger or cooled with a condensed and cooled condensate. These methods may be used alone or in combination. The above cooling temperature is not limited if parts of chlorosilanes are condensed but preferably 10° C. or lower, more preferably −10° C. or lower, the most preferably −30° C. or lower to improve the purity of hydrogen. Most impurities contained in the raw material silicon, such as a heavy metal, phosphorus and boron, can be removed from hydrogen by the operation of removing parts of chlorosilanes, and the purity of the deposited silicon can be improved.

Parts of chlorosilanes are separated and the collected hydrogen has sufficiently high purity but it may contain a relatively large amount of a boron compound according to separation conditions. Therefore, according to the required purity of a silicon product, it is desired that the boron compound should be removed from the hydrogen gas. The method of removing the boron compound is not particularly limited but a method in which a substance having a functional group such as —$NR_2$ (R is an alkyl group having 1 to 10 carbon atoms), —$SO_3H$, —COOH or —OH is contacted to the above hydrogen gas is preferred. The simplest method is to contact an ion exchange resin having any one of the above functional groups to the hydrogen gas.

Any known method may be employed to separate TCS from the gas formed after the production of TCS. For instance, when the above hydrogen is separated, TCS can be separated by purifying the condensed gas by distillation. The residue after the separation of TCS by distillation purification includes a small amount of DCS as a light end, and STC, small amounts of chlorosilanes, oligomers of chlorosilanes and heavy metal compounds as a heavy end.

The above light end does not need to be separated from TCS. However, when it is separated, it is supplied to the STC reduction reaction together with STC or gasified to be supplied to the TCS forming step again. Since the heavy end contains STC as the main component, after STC and heavy metal compounds are separated by a known method, STC is converted into TCS by the reduction step to be described hereinafter or treated in another treating step for its effective use.

To further remove the boron compound from the collected chlorosilanes as a liquid according to the required purity of a silicon product, after the above solid or liquid compound having a functional group is contacted to the chlorosilanes, the reaction product can be purified by distillation as required.

The residue after the separation and collection of most of STC from the heavy end is generally neutralized and abandoned. In this case, as for chlorine lost by this, hydrogen chloride or a chlorosilane may be supplied into the system to compensate for the loss.

It is understood that the closed system in the present invention includes a mode that hydrogen which is inevitably reduced in quantity is supplied.

In the present invention, drive force for recycling is required to recycle the gas. Any known gas pressure device for generating drive force may be employed. As for the installation position of the gas pressure device, it may be installed at an upstream of the TCS forming step in which the apparatuses for the TCS forming step and the step of separating hydrogen from chlorosilanes can be reduced in size, preferably at an upstream of the silicon deposition step in which the total amount of substances for causing a trouble in the pressure device is the smallest.

The silicon production process of the present invention can reduce the amount of STC formed by the silicon deposition reaction to ¼ that of the Siemens process of the prior art in some cases and to ⅕ in others by a multiplication effect obtained by carrying out the silicon deposition reaction at 1,300° C. or higher and adjusting the molar ratio of hydrogen to TCS in the deposition reaction.

Therefore, the process for producing silicon with a closed system for converting the entire amount of STC formed in the silicon deposition step into TCS to be recycled can be extremely advantageously realized. In addition, the size of the apparatus for recycling the gas can be reduced to about ½ or less that of the Siemens process owing to the high reaction rate of TCS and the high yield of silicon.

Figure 4:
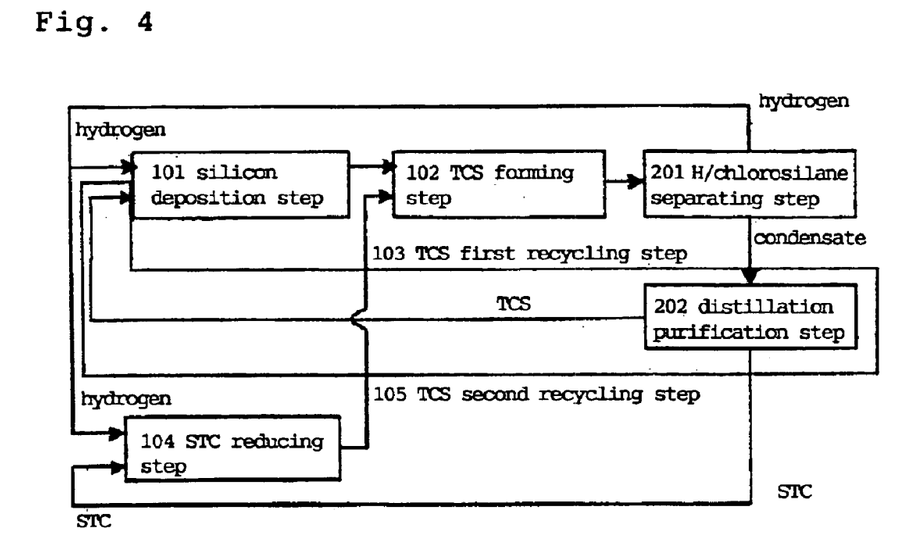
FIG. 4 is a process diagram showing a typical embodiment of the present invention.

FIG. 4 is a process diagram showing the process for producing silicon with the above closed system. As shown in the figure, the process comprises a silicon deposition step 101 for forming silicon by reacting TCS with hydrogen in a hydrogen/TCS molar ratio of 10 or more at a temperature of 1,300° C. or higher, a TCS forming step 102 for forming TCS by contacting the exhausted gas in the above silicon deposition step to raw material silicon to react hydrogen chloride contained in the gas with silicon, a TCS first recycling step 103 for separating TCS from the exhausted gas in the TCS forming step and recycling it to the silicon deposition step, an STC reducing step 104 for obtaining TCS by reducing STC contained in the residue after the separation of TCS in the TCS first recycling step with hydrogen, and a TCS second recycling step 105 for recycling the exhausted gas in the STC reducing step to the above TCS forming step.

A hydrogen/trichlorosilane separation step 201 for separating hydrogen from chlorosilans by condensation is preferably carried out after the above TCS forming step 102 as described above. In the TCS first recycling step 103, the separation of TCS is carried out by a distillation purifying step 202 for purifying a condensate solution from the above hydrogen/trichlorosilane separation step 201 by distillation.

In the above mode, the STC reducing step 104 is a step for converting STC contained in the residue after the separation of TCS into TCS by reacting it with hydrogen after the separation of hydrogen as required. As the reaction conditions may be used known conditions without restriction. To improve the conversion rate and amount of STC into TCS, the reduction reaction temperature is adjusted to 1,300° C. or higher, preferably 1,300 to 1,700° C., particularly preferably 1,410 to 1,700° C. When the reduction reaction temperature is lower than 1,410° C., that is, lower than the melting point of silicon, the deposition of solid silicon in the inside of the reactor can be suppressed by adjusting the molar ratio of hydrogen to the supplied STC to 10 or less. When the reduction reaction temperature is 1,410° C. or higher, the deposit is discharged to the outside of the system as a molten liquid even under conditions that silicon separates out, whereby the molar ratio of hydrogen to STC can be adjusted without restriction.

The reactor used for this reaction is not limited to a particular structure if it can attain a reaction temperature condition. The apparatus shown in FIG. 1 or FIG. 2 used for the silicon deposition reaction is preferably used as a reduction reactor. That is, in this case, STC is supplied from the chlorosilane feed pipe 4.

In the present invention, the above TCS second recycling step 105 is a step for recycling the exhausted gas in the STC reduction step 104 to the above TCS forming step 102 to react hydrogen chloride contained in the gas with raw material silicon. The inventors of the present invention have found that the composition of an exhausted gas from the silicon deposition reaction is very similar to the composition of an exhausted gas from the STC reduction reaction under conditions shown in the present invention. That is, in the TCS forming step 102, the exhausted gases may be treated using a plurality of reactors or may be treated together by using a single reactor.

The silicon production process of the present invention has an advantage obtained by carrying out the deposition of silicon at a temperature of 1,300° C. or higher and an advantage that the amount of the formed STC can be adjusted to a wide range from the above mentioned extremely small amount to the same amount as that of the Siemens process of the prior art by changing the molar ratio of hydrogen to TCS in the silicon deposition step without changing the quality of silicon obtained by the silicon deposition step.

That is, in the Siemens process of the prior art, the hydrogen/TCS molar ratio is controlled under fixed condition at a range of 5 to 10. It is known that when the molar ratio changes during deposition for some reason, the shape and the surface state of the deposit deteriorate extremely, thereby reducing the value of a product, and that a sharp temperature distribution is partially formed during deposition with the result that the deposit is blown, thereby making it difficult to continue deposition any more. Therefore, the operation of greatly changing the molar ratio is actually impossible industrially.

In contrast to this, since the deposition of silicon is carried out at a high temperature close to a melting temperature of 1,300° C. in the silicon production process of the present invention, a deposition reaction proceeds while silicon is partially molten or totally molten at a temperature of its melting point or higher. Silicon can be collected by melting part or all of the deposit from a heated body.

Therefore, even when part of the deposition surface is molten by a change in the above molar ratio, it is substantially unnecessary to take into consideration the shape and surface state of the deposit and it is therefore possible to adjust the hydrogen/TCS molar ratio to any value from any point of time.

Figure 5:
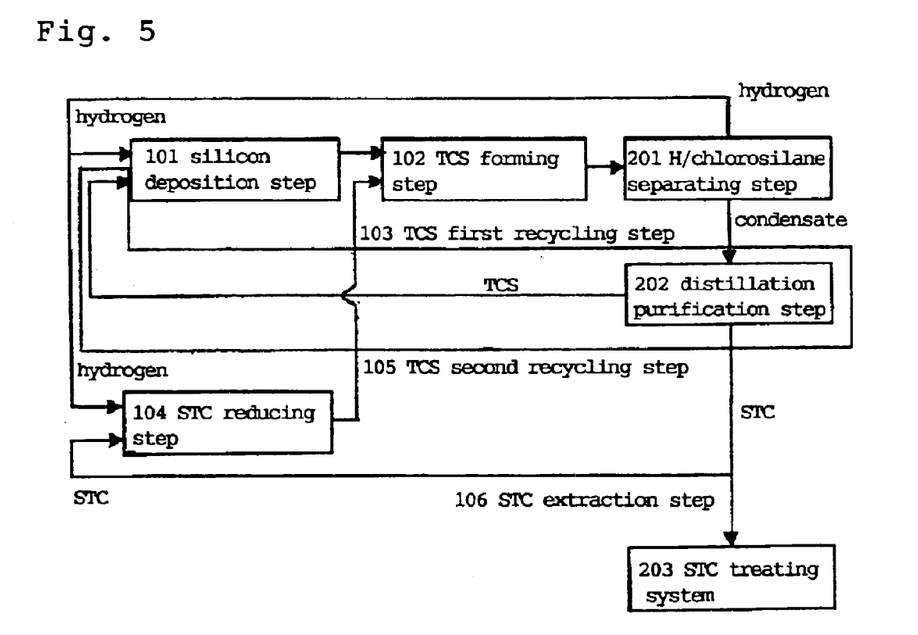
FIG. 5 is a process diagram showing another typical embodiment of the present invention.

That is, according to another embodiment of the present invention, as shown in the process diagram of FIG. 5, there is provided a silicon production process comprising a silicon deposition step 101 for forming silicon by reacting trichlorosilane with hydrogen at a temperature of 1,300° C. or higher, a trichlorosilane forming step 102 for forming trichlorosilane by contacting the exhausted gas in the above silicon deposition step to raw material silicon to react hydrogen chloride contained in the gas with silicon, a trichlorosilane first recycling step 103 for separating trichlorosilane from the exhausted gas in the trichlorosilane forming step and recycling it to the silicon deposition step, a tetrachlorosilane reducing step 104 for obtaining trichlorosilane by reducing part of tetrachlorosilane contained in the residue after the separation of trichlorosilane in the trichlorosilane first recycling step with hydrogen, a trichlorosilane second recycling step 105 for recycling the exhausted gas in the tetrachlorosilane reducing step to the above trichlorosilane forming step, and a tetrachlorosilane supply step 106 for supplying the balance of tetrachlorosilane supplied to the tetrachlorosilane reducing step to a tetrachlorosilane treating system, and the process in which the amount of tetrachlorosilane to be supplied to the tetrachlorosilane treating system is changed by altering the molar ratio of hydrogen to trichlorosilane to be supplied to the silicon deposition step.

In the silicon production process of the present invention, when the molar ratio of hydrogen to TCS is made small, the amount of the formed STC can be made large and when the molar ratio is made large, the amount of the formed STC can be made small. Therefore, the deposition of silicon may be carried out by controlling the molar ratio according to a required amount of STC in the STC treating system 203 in the STC supply step. In general, the molar ratio of hydrogen to TCS can be controlled to a range of 5 to 30.

The above STC treating system includes all the apparatuses capable of making effective use of STC. Typical apparatuses include an apparatus for producing fumed silica by hydrolyzing the above STC with oxyhydrogen flames and an epitaxial apparatus for silicon wafers. Any known apparatus may be used as the STC treating system.

As understood from the above description, according to the process of the present invention, the amount of the formed STC can be reduced to an extremely small value which is totally impossible with the Siemens process by carrying out the silicon deposition reaction between TCS and hydrogen at a high temperature range of 1,300° C. or higher. Thereby, the process of the present invention makes it possible to construct a closed system that the formed STC is not discharged to the outside of the process.

In the silicon deposition reaction at the above high temperature range, by changing the ratio of hydrogen to TCS, the amount of the formed STC can be adjusted to an extremely wide range without affecting the quality of the obtained silicon. Thereby, even when a STC treating system is used, the amount of STC to be supplied to the system can be easily controlled and a well-balanced production mode can be employed.

EXAMPLES

The following examples are provided for the purpose of further illustrating the present invention but are in no way to be taken as limiting.

Example 1

Silicon was produced in accordance with the process shown in FIG. 4 as follows.

In the deposition step 101, the apparatus (deposition surface area of about 400 cm$^2$) shown in FIG. 1 was used to supply TCS and hydrogen in a hydrogen/TCS molar ratio shown in Table 1 and heat the inner wall of the cylindrical vessel 1 at 1,450° C. so as to form silicon. TCS was mixed with part of hydrogen and supplied from the chlorosilane feed pipe 4 and the remaining hydrogen gas was supplied from the seal gas feed pipe 6 as a seal gas to ensure that the total amount of hydrogen should be as shown in Table 1. A small amount of hydrogen was supplied from the seal gas feed pipe 11 as a seal gas. The reaction pressure was 50 kPaG.

Table 1 shows the amount of the deposited silicon, the amount of the formed STC and the amount of the formed hydrogen chloride in the silicon deposition step. The amounts of the formed STC and hydrogen chloride were calculated by analyzing the exhausted gas from the silicon deposition reaction by gas chromatography.

The exhausted gas in the above silicon deposition step was pressurized at about 700 kPaG by a pressure device and heated to be supplied to the TCS forming step 102. In the TCS forming step, a fluidized bed reactor for metallurgical-grade silicon as raw material silicon was used. The reaction conditions of the TCS forming step included a temperature of 350° C., a pressure of 700 kPaG and a raw material silicon charge of about 10 kg. The raw material silicon had an average particle diameter of about 200 μm and a purity of 98% and contained metals such as iron, aluminum, titanium and calcium as the main impurities and also carbon, phosphorus and boron.

A dried hydrogen chloride gas was supplied to the TCS forming step 102. The supply of the hydrogen chloride gas was used to maintain the content of hydrogen in the system shown in Table 1. This amount was balanced with chlorine contained in the chlorosilanes to be discharged to the outside of the system such as the heavy end extracted by a distillation purifying system and STC extracted as a surplus according to circumstances.

In the TCS forming step 102, hydrogen chloride formed in the silicon deposition step 101 and the STC reducing step 104 to be described hereinafter and hydrogen chloride supplied to maintain the content of chlorine in the system were reacted with the raw material silicon to form TCS as the main product and STC as a by-product.

After fine powders of the raw material silicon accompanied by the gas discharged from the TCS forming step 102 were removed by a filter, the gas was supplied to the hydrogen/chlorosilane separation step 201 to be cooled to −30° C. in order to condensate parts of chlorosilanes, thereby separating a hydrogen gas. The separated hydrogen gas was supplied to the above silicon deposition step 101 and the STC reducing step 104 to be described hereinafter.

When the hydrogen gas from which parts of chlorosilanes had been separated was let pass through a vessel filled with 10 liters of an ion exchange resin having a substituent —N(CH$_3$)$_2$ and fully dried, the purity of the silicon deposit was 50 Ω·cm for P type. When the ion exchange resin was not used, the purity of the silicon deposit was 1 Ω·cm for P type.

Meanwhile, the condensed chlorosilanes were supplied to the distillation column of the TCS first recycling step 103 to separate into TCS and the heavy end containing STC and heavy metals.

TCS and STC separated and purified in the TCS first recycling step 103 were gasified, TCS was supplied to the silicon deposition step in an amount shown in Table 1, and STC was supplied to the STC reducing step in an amount shown in Table 2. In the STC reducing step 104, a reduction reaction was carried out by setting the hydrogen/STC molar ratio to 10. As for the supply of hydrogen, the upper limit of the total amount of hydrogen supplied to the silicon deposition step 101 and the STC reducing step 104 was about 50 Nm$^3$/H according to the limitation of the pressure device. A similar reactor to the reactor shown in FIG. 1 was used as the reactor of the STC reduction reaction to supply a mixed gas of STC and hydrogen from the chlorosilane feed pipe 4. Other operation conditions were the same as the silicon deposition reaction.

Table 2 shows the reaction conditions of the STC reduction reaction and the amount of TCS formed by the reaction. The amount of the formed TCS was calculated by analyzing the exhausted gas from the STC reduction reaction by gas chromatography.

The gas exhausted from the STC reduction step was supplied from the TCS second recycling step 105 to the above TCS forming step 102.

Table 3 shows the amount of surplus STC, the amount of surplus STC based on 1 kg of the produced silicon, the total supply of hydrogen for the deposition reaction and STC reduction reaction and the supply of hydrogen based on 1 kg of the produced silicon for evaluating the effect and economic efficiency of the above closed system.

The surplus STC refers to STC which must be discharged to the outside of the system in the STC extraction step 106 as shown in FIG. 5 because a larger amount of STC is still formed by the silicon deposition reaction or the like even when the maximum amount of STC which can be supplied to the STC reduction reaction is supplied.

As described above, according to the present invention, it is understood that the formation of STC can be suppressed in the silicon deposition step 101 and that a closed system for preventing the formation of surplus STC can be constructed even with a small-sized STC reduction reactor.

Examples 2 and 3

Silicon was produced in the same manner as in Example 1 except that the molar ratio of hydrogen to TCS was changed as shown in Table 1 in the silicon deposition step 101.

The amounts of the formed products in each step are shown in Tables 1 to 3 in the same manner as in Example 1. It is understood that an economical closed system can be constructed like Example 1.

Example 4

15.6 kg/H of surplus STC could be formed as shown in Table 3 by changing the molar ratio of hydrogen to TCS in Example 1 to 5 in the silicon deposition step 101. This was calculated to be 14.9 kg of surplus STC based on 1 kg of the produced silicon. Thus, the same amount of STC as surplus STC obtained by the Siemens process to be described hereinafter could be obtained.

Examples 5 and 6

The procedure of Example 1 was repeated except that the deposition reaction temperature in the silicon deposition step 101 was changed to 1,350° C., the molar ratio of hydrogen to TCS was changed as shown in Table 1 and the reduction reaction temperature of the STC reducing step 104 was changed to 1,350° C. as shown in Table 2. The temperature of the inner wall of the cylindrical vessel was raised to 1,450° C. or higher for 5 minutes once every hour to continue the reaction while the deposit was molten and dropped intermittently.

As a result, a closed system could be constructed like Example 1 as shown in Table 3.

As shown in the above Examples 1 to 6, according to the present invention, it is understood that an extremely wide range of operation from the construction of a perfect closed system to the acquisition of a large amount of surplus STC is possible with apparatuses of the same scale by setting the deposition reaction temperature at 1,300° C. or higher in the silicon deposition step 101 and changing the molar ratio of hydrogen to TCS. That is, according to the present invention, it is possible to cope with a change in demand from an STC treating system flexibly without changing the scale of the silicon production apparatus.

Comparative Example 1

A bell-jar type reactor (deposition surface area of about 1,200 cm$^2$) which is generally used in the Siemens process was used in the silicon deposition step 101 and the STC reducing step 104 of Example 1. The deposition reaction temperature and the reduction reaction temperature were set to 1,150° C. which was the upper limit temperature able to be set industrially in the Siemens process of the prior art, and the reaction pressure was 50 kPaG like Example 1.

The molar ratio of hydrogen to TCS in the silicon deposition step 101 was 10 because the industrial upper limit for smoothening the shape of the silicon deposit and maintaining a stable deposition reaction was about 10.

The other steps were carried out under the same conditions as in Example 1.

It is understood from the above Comparative Example that when the deposition of silicon is carried out at a temperature equal to or lower than the melting point of silicon, particularly by the Siemens process of the prior art, a large amount of surplus STC is formed.

As understood from comparison between Comparative Example 1 and Example 4, the output of silicon in Example 4 is about 4 times larger than in Comparative Example 1 even when the apparatuses of the same scale are used, and the process of the present invention has extremely excellent economic efficiency.

TABLE 1

|  | Reaction temperature ° C. | Amount of hydrogen for reaction Nm$^3$/H | Supply of TCS kg/H | Hydrogen/TCS molar ratio | Amount of deposited silicon kg/H | Amount of formed STC kg/H | Amount of formed HCl kg/H | Supply of HCl kg/H |
|---|---|---|---|---|---|---|---|---|
| Ex. 1 | 1,450 | 30 | 12 | 15 | 0.51 | 4.6 | 1.3 | 0.30 |
| Ex. 2 | 1,450 | 30 | 9.1 | 20 | 0.50 | 2.5 | 1.8 | 0.20 |
| Ex. 3 | 1,450 | 30 | 6.0 | 30 | 0.37 | 1.5 | 1.3 | 0.14 |
| Ex. 4 | 1,450 | 30 | 18 | 5 | 1.05 | 17 | 1.1 | 14.1 |
| Ex. 5 | 1,350 | 23 | 14 | 10 | 0.50 | 5.5 | 1.3 | 0.37 |
| Ex. 6 | 1,350 | 30 | 7.4 | 25 | 0.43 | 1.8 | 1.6 | 0.18 |
| C. Ex. 1 | 1,150 | 30 | 18 | 10 | 0.27 | 5.3 | 0.05 | 4.0 |

TABLE 2

|  | Reaction temperature ° C. | Amount of hydrogen for reaction Nm$^3$/H | Supply of STC kg/H | Amount of formed TCS kg/H |
|---|---|---|---|---|
| Ex. 1 | 1,450 | 20 | 15.8 | 4.8 |
| Ex. 2 | 1,450 | 13 | 9.5 | 2.9 |
| Ex. 3 | 1,450 | 8 | 5.9 | 1.8 |
| Ex. 4 | 1,450 | 20 | 15.8 | 4.8 |
| Ex. 5 | 1,350 | 26 | 19.5 | 5.6 |
| Ex. 6 | 1,350 | 10 | 7.5 | 2.2 |
| C. Ex. 1 | 1,150 | 20 | 15.8 | 2.8 |

Ex. = Example, C. Ex. = Comparative Example

TABLE 3

|  | Amount of surplus STC kg/H | Amount of surplus STC based on 1 kg of produced silicon kg | Total amount of hydrogen recycled for deposition reaction and STC reduction reaction Nm³/H | Total amount of hydrogen recycled based on 1 kg of produced silicon Nm³/H |
| --- | --- | --- | --- | --- |
| Ex. 1 | 0 | 0 | 51 | 100 |
| Ex. 2 | 0 | 0 | 43 | 86 |
| Ex. 3 | 0 | 0 | 38 | 103 |
| Ex. 4 | 15.6 | 14.9 | 51 | 49 |
| Ex. 5 | 0 | 0 | 48 | 96 |
| Ex. 6 | 0 | 0 | 41 | 94 |
| C. Ex. 1 | 4.0 | 14.9 | 51 | 189 |

Ex. = Example, C. Ex. = Comparative Example

What is claimed is:

1. A silicon production process comprising:
a silicon deposition step for forming silicon by reacting trichlorosilane with hydrogen at a temperature of 1,3000° C. or higher;
a trichlorosilane forming step for forming trichlorosilane by contacting the exhausted gas in the silicon deposition step to raw material silicon to react hydrogen chloride contained in said exhausted gas with silicon; and
a trichlorosilane first recycling step for separating trichlorosilane from the exhausted gas in the trichlorosilane forming step and recycling it to the silicon deposition step.

2. The process of claim 1, wherein the molar ratio of hydrogen to trichlorosilane is 10 or more in the silicon deposition step.

3. A silicon production process comprising:
a silicon deposition step for forming silicon by reacting trichlorosilane with hydrogen in a hydrogen/trichlorosilane molar ratio of 10 or more at a temperature of 1,3000° C. or higher;
a trichlorosilane forming step for forming trichlorosilane by contacting the exhausted gas in the silicon deposition step to raw material silicon to react hydrogen chloride contained in said exhausted gas with silicon;
a trichlorosilane first recycling step for separating trichlorosilane from the exhausted gas in the trichlorosilane forming step and recycling it to the silicon deposition step;
a tetrachlorosilane reducing step for obtaining trichlorosilane by reducing tetrachlorosilane contained in the residue after the separation of trichlorosilane in the trichlorosilane first recycling step with hydrogen; and
a trichlorosilane second recycling step for recycling the exhausted gas in the tetrachlorosilane reducing step to the trichlorosilane forming step.

4. A silicon production process comprising:
a silicon deposition step for forming silicon by reacting trichlorosilane with hydrogen at a temperature of 1,3000° C. or higher;
a trichlorosilane forming step for forming trichlorosilane by contacting the exhausted gas in the silicon deposition step to raw material silicon to react hydrogen chloride contained in said exhausted gas with silicon;
a trichlorosilane first recycling step for separating trichlorosilane from the exhausted gas in the trichlorosilane forming step and recycling it to the silicon deposition step;
a tetrachlorosilane reducing step for obtaining trichlorosilane by reducing part of tetrachlorosilane contained in the residue after the separation of trichlorosilane in the trichlorosilane first recycling step with hydrogen; and
a trichlorosilane second recycling step for recycling the exhausted gas in the tetrachlorosilane reducing step to the trichlorosilane forming step; and
a tetrachlorosilane supply step for supplying the balance of tetrachlorosilane supplied to the tetrachlorosilane reducing step to a tetrachlorosilane treating system, wherein
the amount of tetrachlorosilane to be supplied to the tetrachlorosilane treating system is changed in the tetrachlorosilane supply step by changing the molar ratio of hydrogen to trichlorosilane to be supplied to the silicon deposition step.

5. The process of claim 3 or 4, wherein the reaction temperature in the tetrachlorosilane reducing step is 1,3000° C. or higher.

6. The process of any one of claims 1, 3 and 4, wherein the exhausted gas which is contacted with the raw material silicon in the trichlorosilane forming step contains hydrogen chloride and tetrachlorosilane as main components.

* * * * *